United States Patent
Thomas et al.

(10) Patent No.: US 8,638,568 B2
(45) Date of Patent: Jan. 28, 2014

(54) MOUNTED CIRCUIT CARD ASSEMBLY

(75) Inventors: Wayne Thomas, Saginaw, MI (US);
Ryan Yaklin, Chesaning, MI (US);
Timothy J. Wandrey, Burton, MI (US);
Jason M. Easlick, Saginaw, MI (US);
Jeremy Breault, Midland, MI (US);
Peter C. Younglao, Freeland, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 57 days.

(21) Appl. No.: 12/870,020

(22) Filed: Aug. 27, 2010

(65) Prior Publication Data
US 2012/0051006 A1 Mar. 1, 2012

(51) Int. Cl.
*H05K 1/11* (2006.01)
(52) U.S. Cl.
USPC .......................... 361/803; 361/730; 361/796
(58) Field of Classification Search
USPC ......... 361/720, 760, 748, 803, 728–730, 721, 361/752, 796, 800
See application file for complete search history.

(56) References Cited

U.S. PATENT DOCUMENTS

| | | | | |
|---|---|---|---|---|
| 5,461,256 A | * | 10/1995 | Yamada et al. | 257/679 |
| 5,570,505 A | * | 11/1996 | Downie et al. | 29/840 |
| 5,742,477 A | * | 4/1998 | Baba | 361/704 |
| 5,898,344 A | * | 4/1999 | Hayashi | 331/67 |
| 6,144,090 A | * | 11/2000 | Higashiguchi | 257/693 |
| 6,195,267 B1 | * | 2/2001 | MacDonald et al. | 361/800 |
| 6,377,464 B1 | * | 4/2002 | Hashemi et al. | 361/760 |
| 6,617,946 B2 | * | 9/2003 | Kennedy et al. | 333/246 |
| 7,507,914 B2 | * | 3/2009 | Levine et al. | 174/260 |
| 7,626,832 B2 | * | 12/2009 | Muramatsu et al. | 361/818 |
| 2009/0011197 A1 | * | 1/2009 | Matsuhira | 428/192 |

* cited by examiner

*Primary Examiner* — Hung S Bui
(74) *Attorney, Agent, or Firm* — Cantor Colburn LLP

(57) ABSTRACT

A mounted circuit card is disclosed that has a housing with a circuit card assembly ("CCA") attached to the housing with adhesive along at least an edge portion of the CCA, where the assembly includes at least one jagged edge portion of the CCA in contact with the adhesive, or at least one channeled portion of the housing in contact with the adhesive, or a combination of both a jagged edge portion of the CCA and channeled portion of the housing in contact with the adhesive.

20 Claims, 2 Drawing Sheets

MOUNTED CIRCUIT CARD ASSEMBLY

FIELD OF THE INVENTION

The subject invention relates generally to circuit card assemblies and more specifically to circuit card assemblies mounted on a support or housing.

BACKGROUND

Circuit card assemblies (CCA's) or printed circuit boards (PCB's) are often mounted onto a housing or support structure (it is noted that while the term CCA may be used to refer to a PCB that has had electronic components physically attached and electrically connected thereto, the terms are often used interchangeably and may be used interchangeably with respect to the disclosure herein). This may be done for a variety of reasons, including providing a heat sink to manage heat generated during operation of the CCA and/or to provide a secure location proximate to system components with which the electronic circuitry of the CCA interact during operation.

One method of mounting a CCA to a housing is to pot the CCA in a resin that is retained by the housing. However, potting the CCA in a housing is in many cases not a viable solution due to a number of issues such as inability to readily remove the CCA from the housing for repair or replacement thus necessitating replacement of the entire mounted assembly, extended times required to cure the resin mass in which the CCA is potted (which is often not acceptable for high-volume rapid manufacturing such as in the motor vehicle field), dimensional stability issues associated with curing the resin mass (e.g., shrinkage, cracking, etc.), poor thermal conductivity of the resin mass, which can interfere with the ability of the CCA to transfer heat to a heat sink for thermal management purposes, and difficulties associated with providing an electrical path to ground through the resin mass.

Accordingly, mounting hardware such as screws have often been used to mount CCA's or PCB's to housings. Mounting screws offer certain advantages, such as ease of removal of the CCA from the housing for repair or replacement. The use of mounting screws, however, causes a number of problems as well. One issue with the use of mounting screws to secure a CCA to a housing is that they cause bending in the CCA, which in turn creates strain. In order to properly secure a CCA to a housing, multiple mounting screws are usually required. If the mounted CCA is to be used in an environment subject to vibration, it may be necessary to tune the modal response of the CCA at least one octave above the resonant frequency of the environmental vibration in order to provide avoid premature vibration-induced failure of the CCA, which can require even more mounting screws. Such use of multiple mounting screws further exacerbates the bending and resultant strain on the CCA. The screw-induced strain on the CCA is greatest in the areas adjacent to each screw, which can lead to premature failure of electronic components or soldered electrical connections in those areas. Attempts to avoid such electrical connection failure have included adding additional layers to the structure of the PCB to mitigate strain, which increases cost. Another technique to manage the strain caused by mounting screws is to design the CCA with 'keep-out' zones around the screw mounting positions. Electrical components and connection pathways are kept out of these keep-out zones, resulting in an increase in the footprint size of the CCA, which both increases cost and often places undesirable design constraints on the system into which the CCA will be incorporated.

Accordingly, it would be desirable to provide a mounted CCA or PCB that would not be subject to the above-described problems.

SUMMARY OF THE INVENTION

In one exemplary embodiment of the invention, there is provided a mounted circuit card that has a housing with a CCA attached to the housing with adhesive along at least an edge portion of the CCA, where the assembly includes at least one jagged edge portion of the CCA in contact with the adhesive, or at least one channeled portion of the housing in contact with the adhesive, or a combination of both a jagged edge portion of the CCA and channeled portion of the housing in contact with the adhesive.

In another exemplary embodiment of the invention, there is provided a method of making a mounted circuit card assembly, comprising the steps of: juxtaposing a circuit card assembly with a housing, and applying adhesive along at least one edge portion thereof such that the adhesive is in contact with the housing and the circuit card assembly, wherein the assembly includes at least one jagged edge portion of the circuit card assembly in contact with the adhesive, or at least one in contact with the adhesive, or a combinations of both a jagged edge portion of the circuit card assembly and a channeled portion of the housing in contact with the adhesive; and curing the adhesive.

The above embodiments provide for secure attachment of a CCA to a housing without the need for screws and their resultant stress on the CCA, providing enhanced durability and reliability of solder joints and electronic components, along with allowing for reduced size (both footprint and thickness). These features are particularly useful for applications in environments such as CCA's used to convert DC power to 3-phase AC power in electric steering systems, as disclosed in U.S. Pat. No. 6,535,805, the disclosure of which is incorporated by reference in its entirety.

The above features and advantages and other features and advantages of the embodiments disclosed herein are readily apparent from the following detailed description of the invention when taken in connection with the accompanying drawings.

BRIEF DESCRIPTION OF THE DRAWINGS

Other objects, features, advantages and details appear, by way of example only, in the following detailed description of embodiments, the detailed description referring to the drawings in which.

DESCRIPTION OF THE EMBODIMENTS

Figure 1:
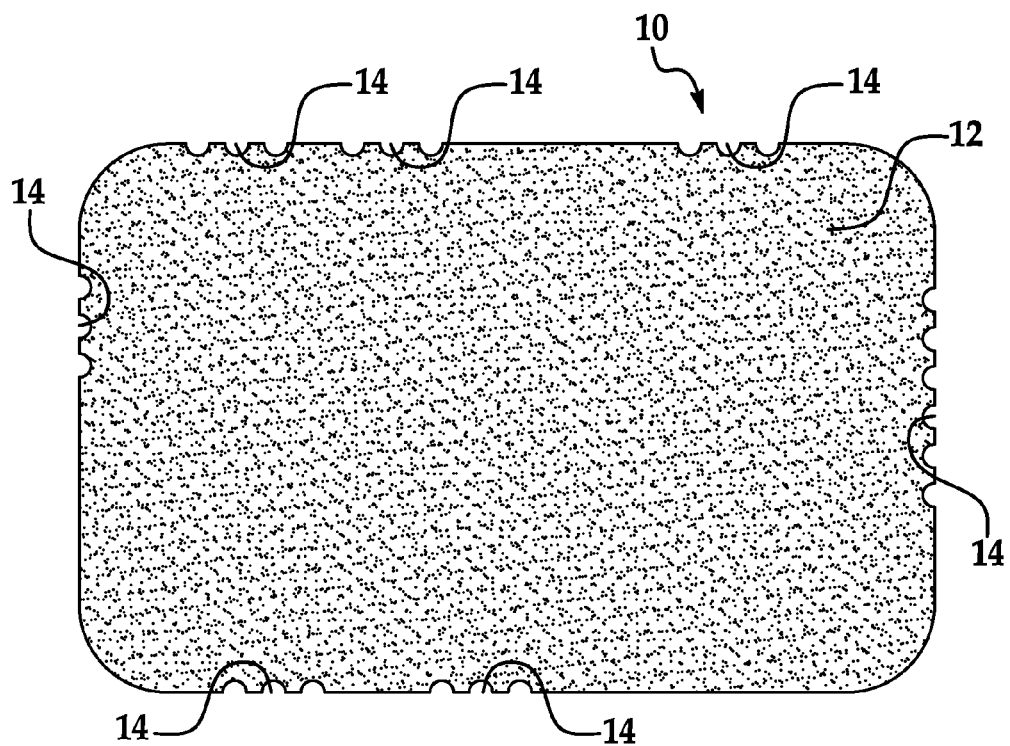
FIG. 1 is a top view of a CCA having attachment enhancing features along edge portions thereof.

In accordance with an exemplary embodiment of the invention, the CCA includes at least one attachment enhancing feature between the CCA and the housing, such as a jagged edge portion on the CCA or a channeled portion of the housing. An exemplary embodiment is illustrated in FIG. 1, which shows a circuit card assembly 10 that is made up of a CCA body 12 having jagged edge portions 14 thereon. In the exemplary embodiment, the jagged edge portions 14 are formed by a plurality of circular shaped openings along the edge of the CCA body 12, although other configurations (e.g., saw tooth, square tooth, irregular) can also be utilized. The dimensions of the jagged edge portions 14 may be adjusted depending on design and manufacturing parameters. Particularly large portions are to be avoided because they may require an excessive amount of adhesive, and particularly small portions are to be avoided because adhesion may not occur in the required area due to the positional tolerance of openings along the jagged edge. In the embodiment where the jagged edge portion 14 is formed by a plurality of circular shaped openings, the diameter of the 'circles' may, in one exemplary embodiment, range from 0.5 mm to 0.6 mm, range from 0.9 mm to 1.0 mm in another exemplary embodiment, and may be about 0.76 mm in yet another exemplary embodiment.

Figure 5:
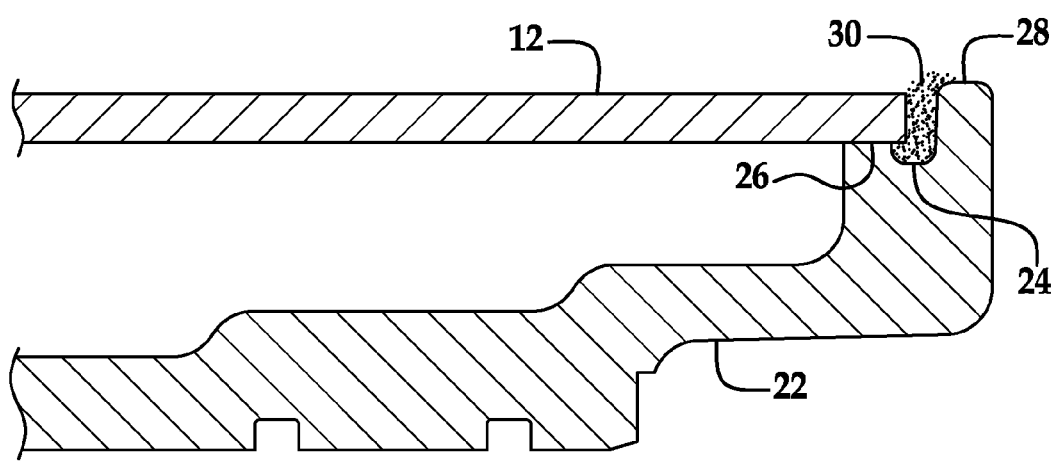
FIG. 5 is a side cross-section view of a CCA mounted on a housing prior and secured by adhesive.

The jagged edge portions 14 can be formed by molding the jagged edges into the body of a printed circuit board when the board is fabricated, or they can be machined into an already formed board such as with a punch or drill press. The jagged edge portions 14 may be located at one or more locations along the edge of the CCA 10, wherever it is desired to attach the CCA 10 to the housing 20, FIG. 2, with adhesive, depending on the design requirements of the system. In one embodiment, the CCA 10 is a multi-sided geometric shape such as a four-edged rectangle or square shape, and each of the edges includes at least one jagged edge portion 14. The CCA 10 may also be circular or oval shaped with jagged edge portions 14 at various intervals along the circular or ovular edge. In another embodiment, the CCA 10 may have a continuous jagged edge portion 14 all the way around. In yet another embodiment, more jagged edge portions than are needed are disposed at various locations along the edge of the CCA 10 and adhesive 30, FIG. 5, is applied only to a portion of these jagged edge portions during assembly, leaving the remaining jagged edge portions available to receive adhesive if the CCA has to be removed and replaced during a repair. In a more specific exemplary embodiment, the jagged edge portions 14 are disposed in pairs, and only one jagged edge portion of each pair has adhesive 30 applied to it during assembly, leaving the other jagged edge portion of the pair available for use during a repair procedure. In high-vibration operating environments, the locations of the adhesive connections between the CCA 10 and the housing 20 in one exemplary embodiment may be selected to tune the modal response of the CCA at least one octave above the resonant frequency of the environmental vibration.

Figure 2:
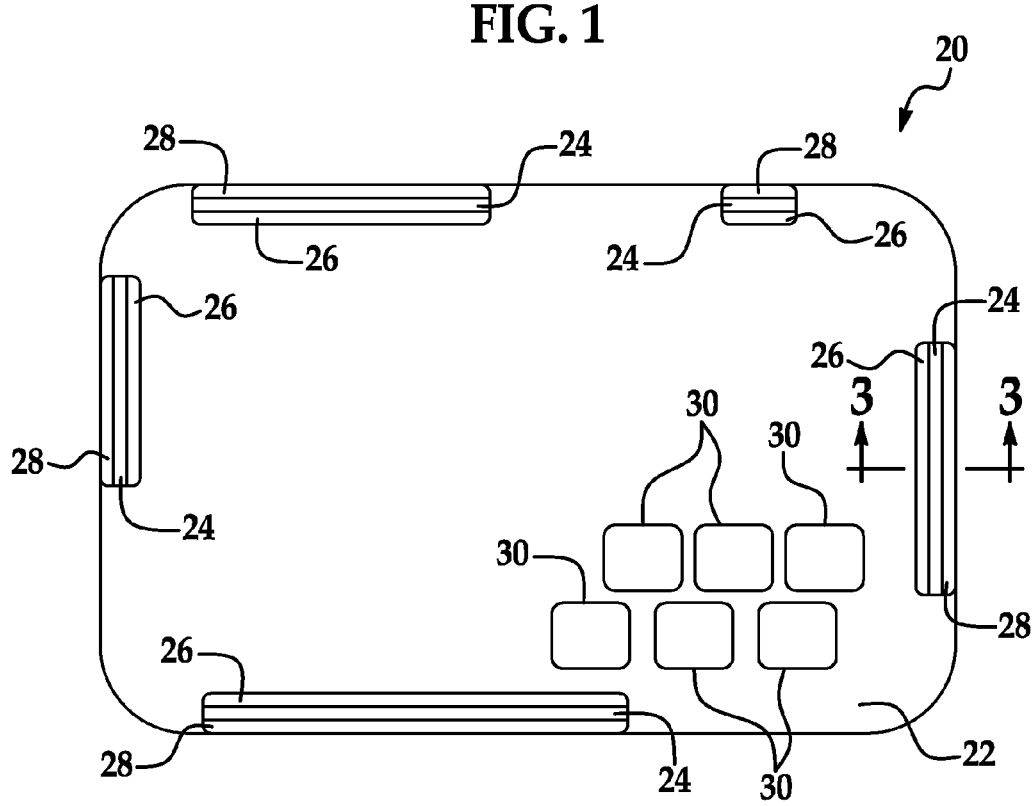
FIG. 2 is a top view of a housing having a channeled portion attachment enhancing feature.
Figure 3:
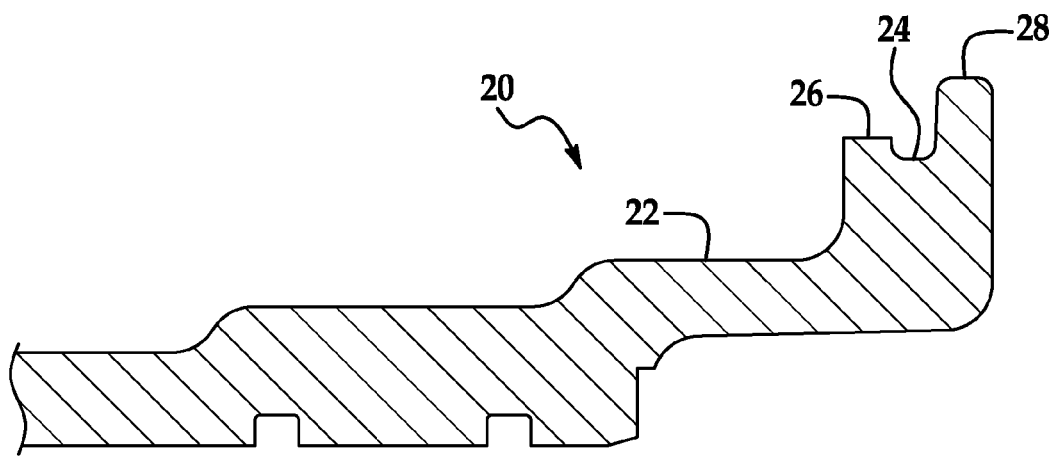
FIG. 3 is a side cross-section view of a portion of a portion of the housing of FIG. 2, taken at section 3-3 showing further detail of the channeled portion attachment enhancing feature.

In another embodiment of the invention, the housing 20 onto which the CCA 10 is mounted includes at least one channeled portion 24 for enhancing attachment between the CCA and the housing. An exemplary embodiment is illustrated in FIGS. 2 and 3, which show a housing 20 for mounting a CCA 10. The housing 20 is made up of housing body 22 having thereon a number of channeled portions 24. The channeled portions 24 each comprise a channel portion having an elevated surface portion 26 and a guide portion 28. The housing body 22 may be formed from any suitable material, such as cast steel. Channeled portions 24 provide extended surface areas for adhesive to bond to, and in one exemplary embodiment have a rough cast surface to further enhance adhesion. The channeled portions 24 may also be surface treated either with chemical etching or with a low-temperature high-energy zero-voltage plasma stream to further enhance adhesion.

Elevated surface portions 26 provide a convenient surface on which the CCA body 12 may be placed prior to application of the adhesive 30, as well as providing a potential electrical path to ground and a path for heat dissipation from the CCA body 12 into the housing body 22. In one exemplary embodiment, the elevated surface portion 26 has a smooth machined surface. Guide portions 28 provide a raised border to help provide proper placement of the CCA 10 on the housing during assembly. Also, adhesive 30 may overflow the channel portions 24 onto part of guide portions 28, so in one exemplary embodiment guide portions 28 have a rough cast surface and/or are chemically or plasma treated to provide enhanced adhesion.

In an additional exemplary embodiment, the housing 20 may also include one or more raised portion(s) 30 along the interior of housing body 22. Raised portion(s) 30 may help provide structural support for the CCA body 12 as well as thermal path(s) for heat dissipation and electrical path(s) to ground. In one exemplary embodiment, the raised portion(s) 30 have a smooth machined surface. It should be noted that the raised portion(s) 30 do not have to make physical contact with the underside of the CCA body 12, and in one exemplary embodiment there is a slight gap of 180-250 µm between the upper surface of the raised portion(s) 30 and the underside of the CCA body 12.

Figure 4:
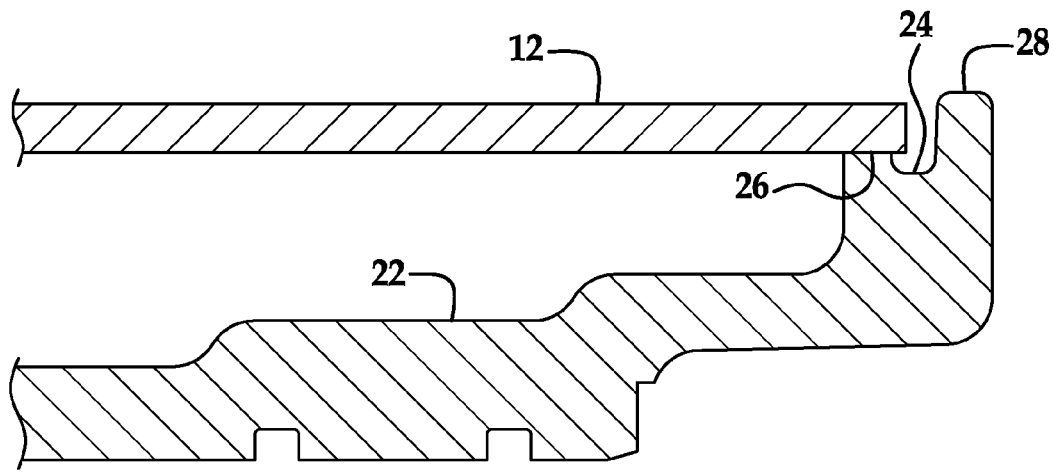
FIG. 4 is a side cross-section view of a portion of a CCA juxtaposed with a housing prior to application of adhesive.

Turning now to FIGS. 4 and 5, the assembly of a mounted circuit card assembly 10 will be described in more detail. Like FIG. 3, FIGS. 4 and 5 are cross-section views of an edge portion of the housing body 22 where the CCA body 12 will be attached. As shown in FIG. 4, CCA body 12 is disposed onto the housing body 22 so that the edge portion of the CCA body 12 rests on elevated portion 26. In one exemplary embodiment, the jagged edge portion 14, FIG. 1, of the CCA body 12 coincides with the channeled portion 24 of the housing 20, although this is not seen in the cross-section view of FIGS. 4 and 5 as the section line is taken at the outermost reach of the jagged edge portion 14.

After placement of the CCA body 12 onto the housing body 22, adhesive 30 is disposed in the channeled portions 24 of the housing body 22 as shown in FIG. 5. Disposing adhesive after placing the CCA body 12 onto elevated portions 26 of the housing 22 keeps any adhesive from being directly sandwiched between the CCA body 12 and the housing body 22, thereby facilitating later removal and replacement of the CCA body 12 should that become necessary for repair. In one exemplary embodiment, sufficient adhesive is disposed into channeled portion 24 so that it will at least partially cover guide portion 28 for further enhancement of adhesion.

In one exemplary embodiment, the adhesive is a liquid that may be injected into the channeled portions 24 by conventional injection techniques. In another embodiment, the adhesive is a powder that may be introduced by conventional powder flow techniques. Virtually any type of known adhesive may be used, including fusible thermoplastic, air-drying solvent-borne or water-borne adhesives, reactive adhesives such as 2-component epoxies or urethanes, air or moisture curable adhesives such as siloxanes, or radiation-curable adhesives. In one exemplary embodiment, the adhesive is a radiation-curable adhesive such as a UV-curable adhesive or electron-beam curable adhesive. Radiation-curable adhesives can provide controlled timing of the cure, which can allow for any final adjustment to the position of the CCA body 12 relative to the housing body 22 before the adhesive is cured. Radiation-curable adhesives can also provide rapid curing upon exposure to radiation, which may be beneficial for high-volume manufacturing. In another exemplary embodiment, the radiation-curable adhesive is a UV-curable adhesive.

Examples of UV-curable adhesives include, but are not limited to, acrylates such as Dymax® 6-621T and 20014, and epoxies such as Loctite® 3336-EN.

In one exemplary embodiment, the mounted CCA 10 is configured for re-use in the event that the CCA has to be removed and replaced during a repair procedure. As discussed above, this may be facilitated by utilizing multiple jagged edge portions 14 on the CCA and applying adhesive 30 to only a portion of the jagged edge portions during initial assembly, and/or applying adhesive after disposing the CCA body 12 onto the elevated portion 26 of the housing body 22. To later remove the CCA body 12 from the housing body 22, heat is applied locally along the adhesive bond (e.g., with a pinpoint hot air tool) to raise the cured adhesive above its glass transition temperature. The softened adhesive 30 may then be carefully removed to free the CCA body 12 from the housing body 22. To replace the CCA body 12 onto the housing body 22 after it has been repaired, the CCA body 12 is replaced onto the housing body 22 so that it rests on the elevated portions 26, and adhesive 30 is applied to the jagged edge portions that were not utilized during the initial assembly.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the present application.

What is claimed is:

1. A mounted circuit card assembly, comprising:
    a housing; and
    a circuit card assembly having a multi-sided geometric shape, each side of the geometrical shape defining an edge portion of the circuit card assembly, or a circular or oval shape that defines a single continuous edge portion of the circuit card assembly, wherein the circuit card assembly is attached to the housing with adhesive along at least one edge portion of the circuit card assembly;
    wherein the attached edge portion of the circuit card assembly includes a non-jagged edge portion and a jagged edge portion and the jagged edge portion is in attachment-enhancing contact with the adhesive, or the housing includes at least one channeled portion where the adhesive is adhered to the channeled portion of the housing and the attached edge portion of the circuit card assembly, or combinations thereof.

2. The mounted circuit card assembly according to claim 1, wherein the attached edge portion of the circuit card assembly includes a jagged edge portion in attachment-enhancing contact with the adhesive.

3. The mounted circuit card assembly of claim 1, wherein the housing includes a channeled portion in contact with the adhesive.

4. The mounted circuit card assembly of claim 3, wherein the at least one channeled portion of the housing has an elevated surface, with respect to the bottom of the channeled portion, adjacent thereto.

5. The mounted circuit card assembly of claim 4, wherein the circuit card assembly is in direct contact with the elevated surface of the housing.

6. The mounted circuit card assembly of claim 1, wherein the circuit card assembly includes at least one portion having a jagged edge portion in contact with the adhesive, and the housing includes a channeled portion in contact with the adhesive.

7. The mounted circuit card assembly of claim 1, wherein the adhesive is a UV-curable adhesive.

8. The mounted circuit card assembly of claim 1, wherein the jagged edge portion comprises a plurality of circular shaped openings along an edge portion of the circuit card assembly.

9. The mounted circuit card assembly of claim 1 wherein the circuit card assembly is a four-sided square or rectangular shape, and includes a jagged edge portion along each said four sides.

10. The mounted circuit card assembly of claim 1, wherein the circuit card assembly includes a non-jagged edge portion and a jagged edge portion along the edge portion of each said multiple sides of the geometric shape.

11. The method of making a mounted circuit card assembly, comprising the steps of:
    juxtaposing a circuit card assembly with a housing, wherein the circuit card assembly has a multi-sided geometrical shape, each side of the geometrical shape defining an edge portion of the circuit card assembly, or a circular or oval shape that defines a single continuous edge portion of the circuit card assembly, and applying adhesive along at least one edge portion thereof such that the adhesive is in contact with the housing and the circuit card assembly,
    wherein said at least one edge portion of the circuit card assembly includes a non-jagged edge portion and a jagged edge portion and the adhesive is applied to the jagged edge portion, or the housing includes a channeled portion in contact with the adhesive, or combinations thereof; and
    curing the adhesive.

12. The method of claim 11, wherein the circuit card assembly includes a jagged edge portion in contact with the adhesive.

13. The method of claim 11, wherein the housing includes a channeled portion in contact with the adhesive.

14. The method of claim 13, wherein the at least one channeled portion of the housing has an elevated surface, with respect to the bottom of the channeled portion, adjacent thereto.

15. The method of making a mounted circuit card assembly according to claim 11, wherein the circuit card assembly includes a jagged edge portion, and the housing includes a channeled portion in contact with the adhesive.

16. The method of claim 11, wherein the adhesive is a UV-curable adhesive and the curing step includes exposing the adhesive to UV radiation.

17. The method of claim 11, wherein the jagged edge portion comprises a plurality of circular shaped openings along an edge portion of the circuit card assembly.

18. A mounted circuit card assembly, comprising:
    a housing; and
    a circuit card assembly attached to the housing with adhesive along an edge portion of the circuit card assembly;
    wherein the circuit card assembly includes a jagged edge portion in contact with the adhesive, or the housing includes a channeled portion of the housing in contact with the adhesive, or combinations thereof.

19. The mounted circuit card assembly of claim 18, wherein the circuit card assembly further comprises a jagged edge portion not in contact with adhesive.

20. The mounted circuit card assembly of claim 18, wherein the circuit card assembly includes a jagged edge portion in attachment-enhancing contact with the adhesive.

* * * * *